United States Patent [19]

Fukunaga

[11] Patent Number: 5,713,751
[45] Date of Patent: Feb. 3, 1998

[54] IC SOCKET

[75] Inventor: Masami Fukunaga, Kawaguchi, Japan

[73] Assignee: Enplas Corporation, Kawaguchi, Japan

[21] Appl. No.: 623,705

[22] Filed: Mar. 29, 1996

[30] Foreign Application Priority Data

Mar. 31, 1995 [JP] Japan ................................. 7-076140

[51] Int. Cl.⁶ ........................................... H01R 11/22
[52] U.S. Cl. ................................................ 439/266
[58] Field of Search ........................ 439/70, 71, 72, 439/73, 264, 265, 266, 268, 330, 331

[56] References Cited

U.S. PATENT DOCUMENTS

| | | | |
|---|---|---|---|
| 4,993,955 | 2/1991 | Savant | 439/266 |
| 5,288,240 | 2/1994 | Savant | 439/266 |
| 5,308,256 | 5/1994 | Tonooka et al. | |
| 5,364,284 | 11/1994 | Tohyama et al. | |

FOREIGN PATENT DOCUMENTS 6-73888  10/1994  Japan .

*Primary Examiner*—Khiem Nguyen
*Assistant Examiner*—Yong Ki Kim
*Attorney, Agent, or Firm*—Cushman, Darby & Cushman IP Group of Pillsbury Madison & Sutro LLP

[57] ABSTRACT

An IC socket includes a base constructed integral with a top face for placing the resting portions of contact pins, an back face opposite to the top face, space passing through the base just under the back face, a plurality of first slit holes extending outwardly from the space, and a plurality of second slit holes arranged among the first slit holes adjacent to one another and outside the first slit holes. First contact pins are such that their pillar portions are inserted in the first slit holes, and second contact pins are such that their pillar portions are inserted in the second slit holes. In this way, all the contact pins is mounted to the base. The first and second contact pins are electrically connected with the leads of an integrated circuit by sandwiching the leads between the resting portions and the contact portions of the contact pins. Thus, in the IC socket, it is possible to reduce the product variation with respect to the contact resistance between each of the leads of the integrated circuit and each of the contact pins, and to mold the base with a relatively simple die.

4 Claims, 6 Drawing Sheets

IC SOCKET

BACKGROUND OF THE INVENTION a. Field of the Invention

This invention relates to an IC socket on which electric parts such as those of an integrated circuit are mounted so that they can be electrically connected with an external circuit.

b. Description of Related Art

FIGS. 1 to 3 show a general structure of an example of a conventional, well-known IC socket and its operating procedure. As illustrated in the left-hand section of the half of FIG. 1, an IC socket 10 is equipped with a cover 11 which is rectangular in shape, as viewed from above, and a base 12 assuming a rectangular shape similar to the cover 11. A pillar 13 of the cover 11 is fitted into and free to slide along a normal hole 14 of the base 12 so that the cover 11 can be moved in a vertical direction of the base 12. The cover 11 is always biased upwardly by a spring, not shown, and unless the cover 11 is urged downwardly, the cover 11 and the base 12, as shown in FIG. 1, are positioned at a constant distance from each other.

At the opposite ends of the base 12, as shown in the right half of FIG. 1, a great number of contact pins 15 constructed of electrically conductive materials are arranged parallel with one another in a direction perpendicular to the plane of the figure and at intervals identical with those among mutual leads of an integrated circuit which will appear later. Each of the contact pins 15 includes a contact portion 15A coming in contact with each lead of the integrated circuit. A curved portion 15B of an arcuate shape is free to flex and provides each contact pin 15 with resilience. A pillar portion 15C extends downwardly from the curved portion 15B. A base portion 15D connects the curved portion 15B with the pillar portion 15C and abuts on a fixed surface 12B of the base 12. A leg portion 15E follows the pillar portion 15c and extends in the same direction as the pillar portion 15C. A working portion 15F extends from the curved portion 15B at an angle with the contact portion 15A and in a direction different therefrom. The pillar portion 15C is tightly fitted into each of holes 16 configured in the base 12, thereby fixing the contact pin 15 on the base 12.

When the cover 11, which has a projecting cam 11A extending downwardly, is pressed down, the projecting cam 11A is adapted to come in contact with the working portion 15F of each contact pin 15 and at the same time, slide perpendicular thereto.

Where the IC socket is not used, as shown in FIG. 1, the contact portion 15A of each contact pin 15 is in contact with a top face 12A of the base 12. When the IC socket 10 is used, on the other hand, the cover 11 is pressed down toward the base 12, as shown in FIG. 2. In doing this, the projecting cam 11A of the cover 11 is also moved in a downward direction while contacting the working portion 15F of the contact pin 15. By this downward movement of the projecting cam 11A, the working portion 15F is urged to the right of FIG. 1. Hence, the curved portion 15B of each contact pin 15 is flexed, with the result that the contact portion 15A of the contact pin 15 is separated from the top face 12A of the base 12.

After that, an integrated circuit to be tested is place on the top face 12A of the base 12. Subsequently, when the downward pressure of the cover 11 is relieved, the cover 11 is automatically moved upwardly relative to the base 12 by the action of the spring (not shown), and at the same time, the contact portion 15A of the contact pin 15 is automatically restored to the original position of FIG. 1. In this case, since each lead 18 of the integrated circuit 17 is already placed on the top face 12A of the base 12, the contact portion 15A of each contact pin 15 is brought into contact with each lead 18 of the integrated circuit 17.

Since, as mentioned above, the contact pins 15 are arranged at intervals equal to those of the leads 18, all of the contact pins 15, as shown in FIG. 3, are in contact with all the corresponding leads 18.

An electric current is then supplied through the leg portion 15E of each contact pin 15 to each lead 18 of the integrated circuit 17, thereby allowing desired tests for the possible failure of electrical connection, and the like, to be made. When the cover 11 is again pressed downwardly after the tests have been completed, the contact portion 15A of each contact pin 15 is disengaged from each lead 18 of the integrated circuit 17, and thus the integrated circuit 17 can be taken out.

In keeping with the high density of the integrated circuit 17, the leads 18 of the integrated circuit 17 increase in number, and spaces among the leads 18 tend to narrow. To resolve this problem, the contact pins 15 of the IC socket must also be increased in number, and thus, spaces among the contact pins 15 have become more and more narrow. The narrowness of spaces among the contact pins 15 makes it difficult to connect the leg portion 15E of each contact pin 15 with the external circuit.

Thus, for example, an arrangement has been made such that each contact pin 15 in which the leg portion 15E is located far from the center of the base 12 (FIG. 4A) alternates with a contact pin 15 which is located closer to the center (FIG. 4B). Thus, the space between the leg portions 15E of adjacent contact pins can be increased to facilitate an easier connection between each leg portion 15E and the external circuit.

However, it is unavoidable that the array of the leg portions 15E alternately arranged at different positions in this way causes an increase in the width of the IC socket (the dimension in the direction indicated by an arrow X in FIG. 4A).

In general, testing for integrated circuits is performed in such a way that a number of IC sockets are placed on a single circuit substrate. Integrated circuits are mounted on these IC sockets, which are admitted to a thermoregulator to test a number of integrated circuits at a time. The efficiency of the testing of integrated circuits thus depends upon how many IC sockets are placed on each circuit substrate of the same size. Hence, if the width of the IC socket is increased, the number of IC sockets that can be placed on a single circuit substrate will be limited, and the efficiency of the testing of integrated circuits will be lowered.

If the space between the leg portions 15E of adjacent contact pins is diminished, the width of the IC socket can be decreased. In doing so, it becomes difficult to connect each leg portion 15E with the external circuit, and, for example, where both are connected by soldering, solder sometimes adheres to the leg portions 15E of adjacent contact pins.

Thus, in order to reduce the width of the IC socket without narrowing the space between the leg portions 15E of adjacent contact pins, it is considered that the contact pin 15 in which the leg portion 15E is located closer to the center of the base 12 (FIG. 4B) is placed to lie under the top face 12A of the base 12. For this purpose, as shown in FIG. 5, it is necessary to provide a hole 16 for inserting the pillar portion 15C of the contact pin 15 and a recess 19 for fitting the pillar portion 15C into the hole 16 from the upper direction thereof. Since the IC sockets, as mentioned above, are generally constructed such that a number of IC sockets are loaded on a single circuit substrate, there is a necessity for facilitating mass production. Thus, each contact pin 15 is often produced by stamping sheet metal, such as beryllium copper, and the base 12 is made by die molding on insulating material, such as synthetic resin.

However, for the structure in which the hole 16 and the recess 19 are configured under the top face 12A, if an attempt is made to mold the base 12 by the use of a die, pieces of the die located in the hole 16 and the recess 19, after molding, must be pulled out in directions indicated by arrows α and β, respectively, of FIG. 5 to take out the molded base 12 from the die.

A die in which one piece can be moved in the direction of the arrow α and another piece can be moved in the direction of the arrow β is complicated in structure and is difficult to make. Furthermore, a large number of parts are needed for the die, with a resulting increase in manufacturing cost of the IC socket.

FIGS. 6A and 6B show an example of a conventional IC socket for solving the above problem. This IC socket is designed so that the base 12 is divided into base segments 12C and 12D at the upper end of a portion corresponding to the recess 19 (see FIG. 6B). After the contact pins 15 are fitted into the holes 16 provided in the base segment 12D, the base segments 12C and 12D are coupled by a rivet 20 (see FIG. 6A).

The IC socket thus constructed, because the base segment 12C is not provided with the recess 19 and the hole 16, there is no need for a die of complicated structure to mold the base segment 12C. Moreover, the base segment 12D is constructed such that the holes 16 are provided, but a portion corresponding to the recess 19 assumes the shape of an offset 21, and thus it is not necessary to make the piece of the die which must be moved in the direction of the arrow β as shown in FIG. 5. In this way, since the base segment 12D after molding can be removed from the die by merely moving vertically a piece for opening the die as shown in FIG. 6B, a die of complicated structure is not required. The leg portion 15E of each contact pin 15, as shown in FIG. 6A, can be placed under the top face 12A, and hence the width of the base 12 can be reduced.

However, the IC socket constructed as shown in FIGS. 6A and 6B requires two kinds of dies. In addition, since the base segments 12C and 12D are coupled, dimensional errors due to their molding cause considerable variation in the height of the top face 12A, and the resilient pressure of the contact-portion 15A of each contact pin 15 against the top face 12A varies. Hence, the contact pressure of the contact pin 15 against each lead 18 of the integrated circuit 17 also varies. This results in an IC socket in which the resistance of contact between each lead 18 and each contact pin 15 varies greatly with product. Furthermore, because of dimensional errors due to assembly where the base segments 12C and 12D are coupled, depending upon circumstances, cases may arise in which variation in the contact resistance becomes wider.

In order to control such variation in the resistance of contact between the lead 18 and the contact pin 15, it is desirable that portions constructed with, at least, the top face 12A of the base 12 and the holes 16 for implanting the contact pins 15 therein are integrally molded by using a single die. In order to achieve this, an IC socket such as that set forth in Japanese Patent Preliminary. Publication No. Hei 5-152392 is available in which the contact pins are mounted on the base from the side of the IC socket. For this IC socket, only a structure for mounting the contact pins will be briefly explained below in accordance with. FIG. 7.

Each contact pin 15 has two base portions 15D and 15D', and is provided with an upwardly sticking projection 15D" at the tip of the base portion 15D'. The contact pin 15 is inserted parallel to the base 12 from the side of the IC socket so that a base segment 12E of the base 12 is sandwiched between the two base portions 15D and 15D' and the projection 15D" is engaged with the recess of the base 12, thereby mounting the contact pin 15 to the base 12. Thus, this IC socket is not provided with the holes 16 bored vertically as in the above IC socket, and thus where the base 12 is molded by a die, the structure of this die does not become complicated, and the leg portions of the contact pins can be situated under the portion on which the leads 18 are placed.

With this structure, however, because the base portion 15D' is inserted in the base 12 from the side and the projection 15D" is engaged upwardly with the recess bored, it is unavoidable that the amount of upward projection of the projection 15D" is limited. Moreover, a lateral force is maintained only by the engagement of the projection 15D" slightly projected upwardly with the recess. Consequently, the mounting of the contact pin 15 is liable to become unstable.

SUMMARY OF THE INVENTION

Therefore, a first object of the present invention is to provide an IC socket in which molding is possible without using a die having a complicated structure, the leg portion of each contact pin can be placed under the top face of the base, and the resistance of contact between each of the leads of electric parts and each contact pin does not vary with product.

A second object of the present invention is to provide an IC socket in which after each contact pin is attached to the base, the mounting of the contact pin to the base does not become unstable.

In order to achieve the first object, the IC socket according to the present invention includes contact pins each having a leg portion for connection with an external circuit in the lower portion, a contact portion for contact with each of the leads of electric parts in the upper portion, and a base portion extending laterally between the leg portion and the contact portion; and a base having a fixed face with which the base portions of the contact pins come in close contact, regarding holes in which the leg portions are inserted when the contact pins are mounted and a top face for placing the leads of electric parts directly or indirectly, located above the holes. The holes are spaced away from each other approximately under the back of the top face, and a space passing through the base downwardly is formed Just under the back of the top face so that portions in which, at least, the top face and the holes of the base are provided are integrally constructed.

In order to achieve the second object, the IC socket according to the present invention is equipped with contact pin fixing blocks for pressing and mounting the base portions of the contact pins under the back of the top face of the base.

According to the IC socket of the present invention, the space passing downwardly through the base is formed just under the opposite face of the top face. Hence where the base is molded by a die, a piece of the die for molding the opposite face of the top face ranges from the lower portion of the base to the opposite face of the top face. Thus, when the base after molding is removed from the die, it is only necessary to open the die vertically with respect to the base and move the piece for molding the opposite face of the top face downwardly. In this way, the molded base can be taken out from the die. Thus, the base has a structure in which the leg portions of the contact pins are provided under the top face. The base has portions in which, at least, the top face and the portion of the base holes for implanting the contact pins therein, are provided and integrally molded by a single die, without using the die of complicated structure. Consequently, variations in the product with respect to the resistance between each lead of the integrated circuit and each contact pin can be limited.

According to a further aspect of the present invention, the holes are spaced away from each other approximately under the opposite face of the top face, and thus the leg portions of the contact pins can be arranged just under or inward of the top face.

According to another aspect of the present invention, contact pin fixing blocks mount the base portions of the contact pins under the opposite face of the top face. Thus, even though each contact pin tends to slip out of the hole, its upward movement will be prevented by each contact pin fixing block whose position is restricted by the opposite face of the top face.

These and other objects as well as the features and advantages of the present invention will become apparent from the following detailed description of the preferred embodiments when taken in conjunction with the accompanying drawings.

DETAILED DESCRIPTION OF THE PREFERRED EMBODIMENTS

In the description of the embodiments of the present invention, like numerals are used in practically like parts and members as the conventional IC socket already described.

Figure 1:
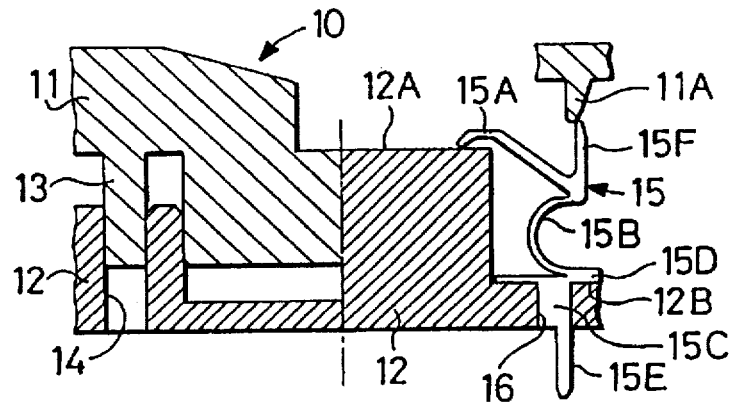
FIG. 1 is a sectional view schematically showing the structure of essential parts of an example of a conventional IC socket.
Figure 2:
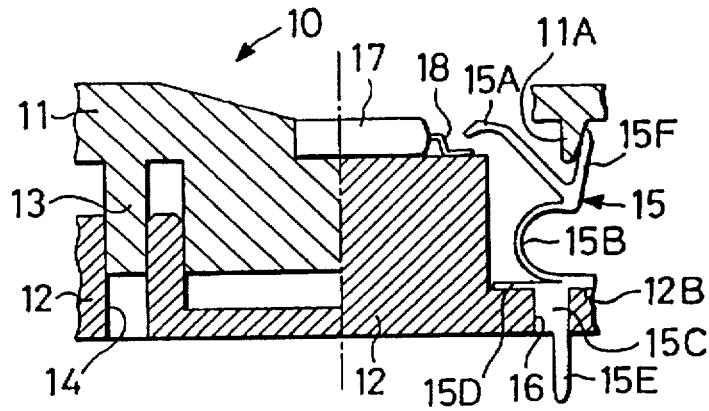
FIG. 2 is a sectional view schematically showing one operating procedure of the IC socket of FIG. 1.
Figure 3:
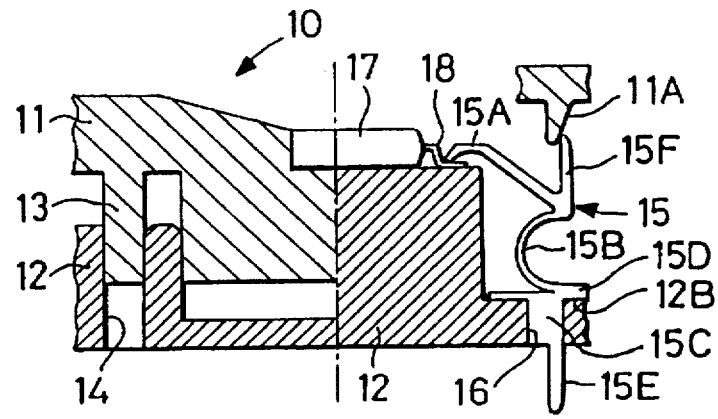
FIG. 3 is a sectional view, similar to FIG. 1, schematically showing a case where electronic parts are loaded.
Figure 4A:
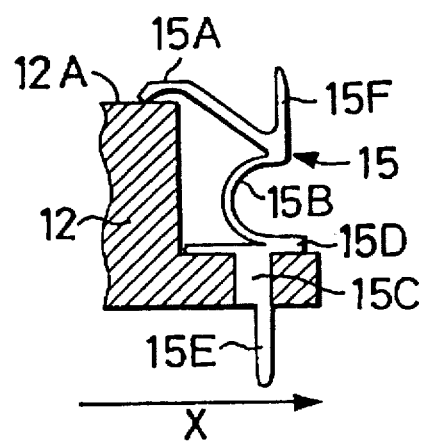
FIGS. 4A and 4B are sectional views showing essential parts of the conventional IC socket whose contact pins are mounted in different states.
Figure 4B:
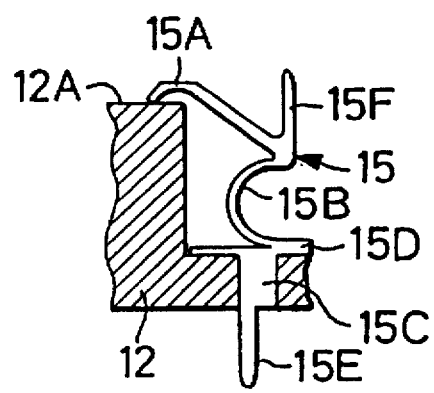
Figure 5:
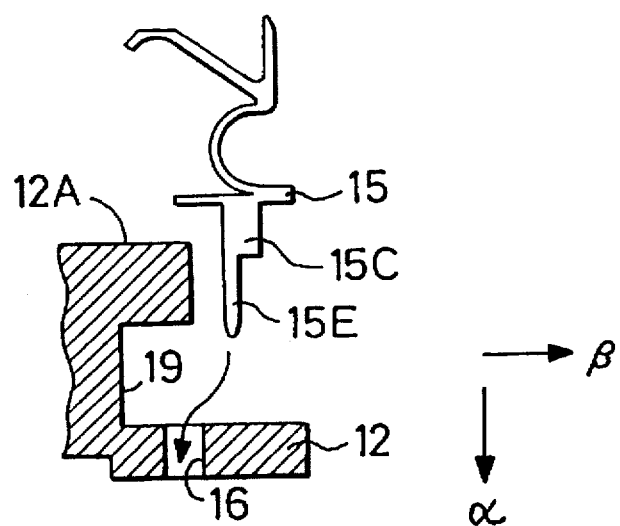
FIG. 5 is an explanatory view showing an example of the structure of a base and a way to mount the contact pin to the base in the conventional IC socket.
Figure 6A:
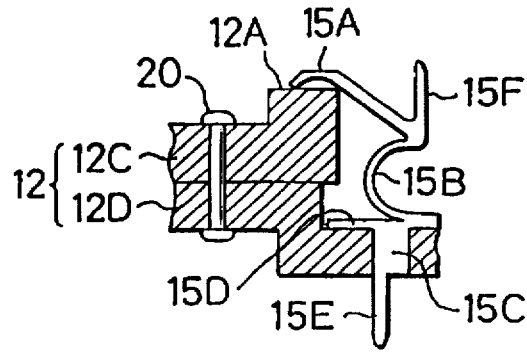
FIG. 6A is a sectional view schematically showing the structure of essential parts of another example of the conventional IC socket in a case where the contact pin is mounted to the base.
Figure 6B:
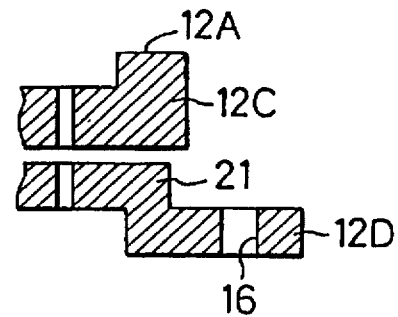
FIG. 6B is a sectional view schematically showing essential parts of the IC socket of FIG. 6A before the contact pin is mounted to the base.
Figure 7:
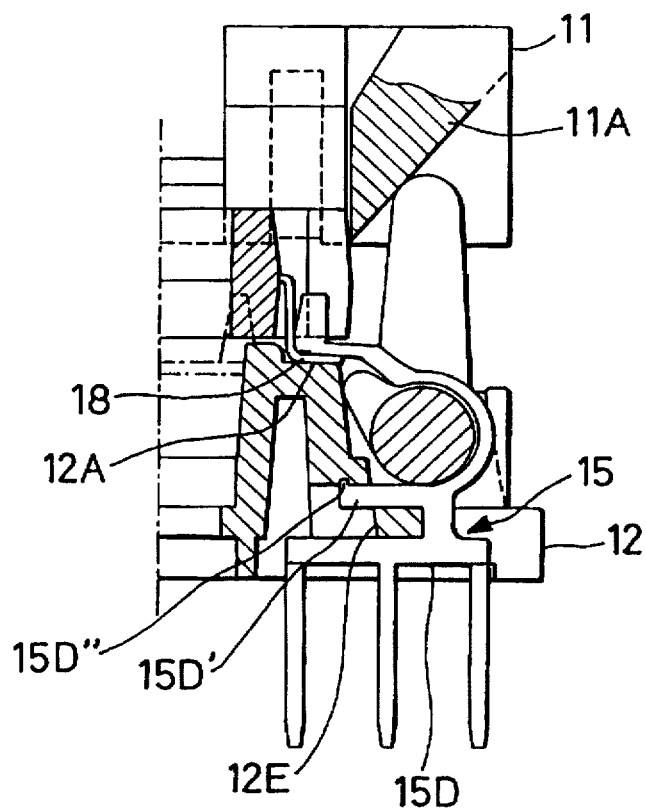
FIG. 7 is a sectional view schematically showing the structure of essential parts of still another example of the conventional IC socket.
Figure 8A:
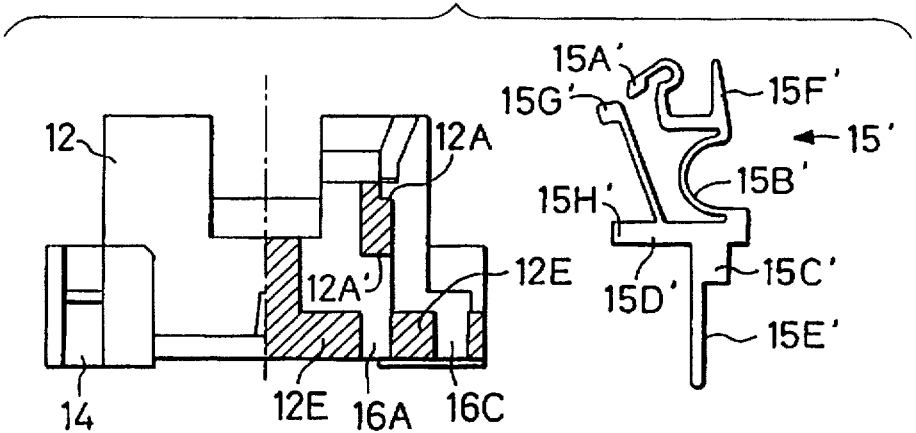
FIG. 8A is a view showing a socket body of one embodiment of the IC socket according to the present invention and the profile of a contact pin to be incorporated therein.
Figure 8B:
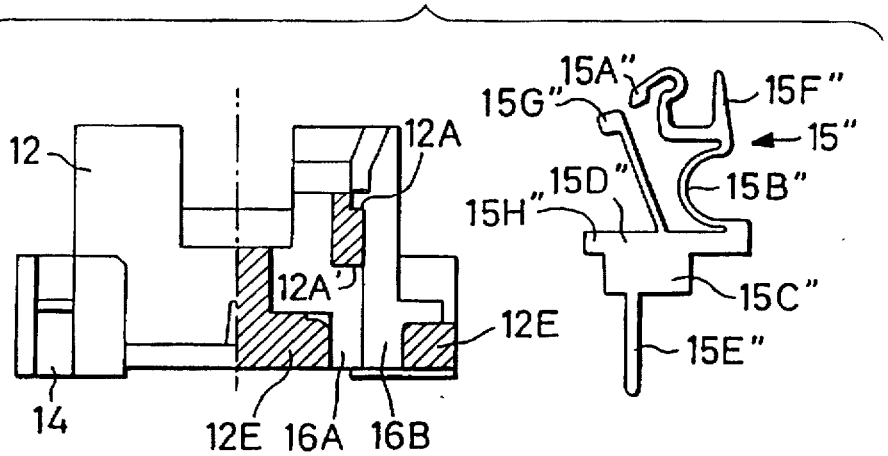
FIG. 8B is a view showing a socket body of different structure from that of FIG. 8A and the profile of a contact pin to be incorporated therein.
Figure 9A:
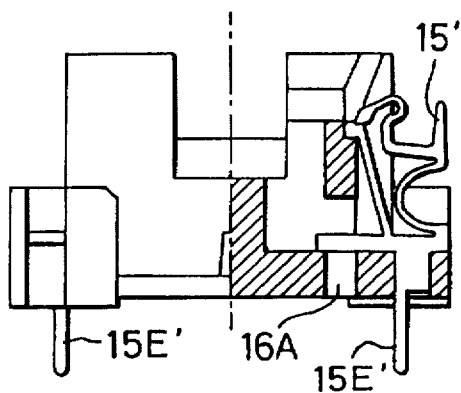
FIG. 9A is a view showing a case where the contact pin is incorporated in the socket body of FIG. 8A.
Figure 9B:
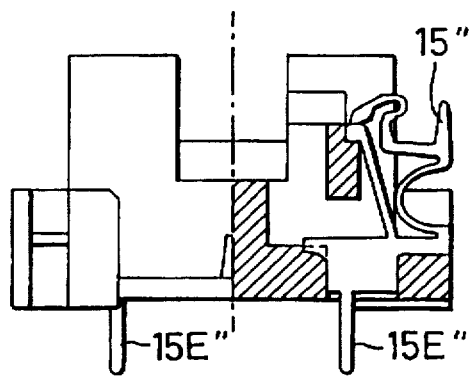
FIG. 9B is a view showing a case where the contact pin is incorporates in the socket body of FIG. 8B.
Figure 10:
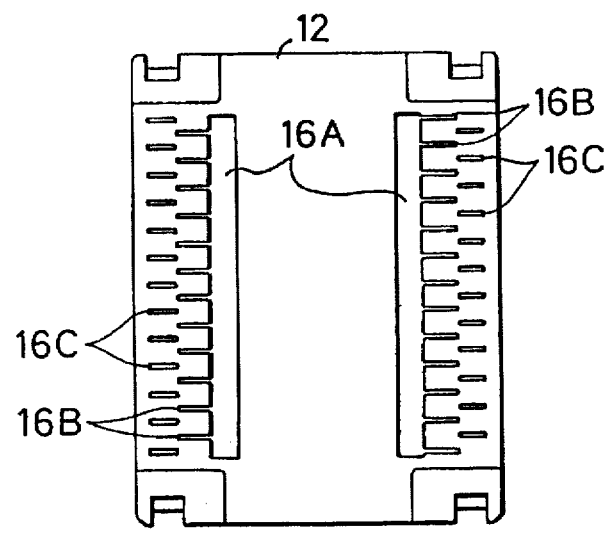
FIG. 10 is a bottom view showing the socket body of each of FIGS. 8A and 8B.

FIGS. 8A, 8B, 9A, 9B, and 10 show a base and contact pins used in one embodiment of the IC socket according to the present invention. Specifically, FIG. 8A shows, in the right-hand diagram, one of contact pins 15' each having a leg portion far from the center of the base and in the left-hand diagram, the side of the base 12 on the left thereof and the section-of a portion for implanting each contact pin 15' in the base 12 on the right. FIG. 8B shows, in the right-hand diagram, one of contact pins 15" each having a leg portion closer to the center of the base, and in the left-hand diagram, the side of the base 12 on the left thereof and the section of a portion for implanting each contact pin 15" in the base 12 on the right. FIG. 9A shows the case where the contact pin 15' of FIG. 8A is implanted in the base 12, and FIG. 9B shows the case where the contact pin 15" of FIG. 8B is implanted in the base 12. FIG. 10 illustrates the bottom of the base 12.

This embodiment is not designed so that the leads 18 of the integrated circuit 17 are placed directly on the top face 12A of the base 12, but so that resting portions 15G' and 15G" of contact pins 15' and 15" are first placed on the top face 12A shaped into an offset-like form. The leads 18 of the integrated circuit 17 are placed on the resting portions 15G' and 15G". Each of the leads 18 put on the resting portions 15G' and 15G" is sandwiched between each of the contact portions 15A' and 15A" and each of the resting portions 15G' and 15G", so that the contact pins 15' and 15" are electrically connected with the leads 18.

Holes 16A are provided just under the top face 12A of the base 12. From the holes 16A, a plurality of slit-shaped holes 16B are configured so as to protrude in the box (see FIG. 10). Moreover, slit-shaped holes 16C are provided among individual holes 16B and close to the ends of the base 12.

Each contact pin 15" is introduced into the base 12 obliquely from above the outside of the base 12 while avoiding contact with the lower portion of the top face 12A. A pillar portion 15C" of the contact pin 15" is inserted to extend from the hole 16A to the hole 16B. In this way, each contact pins 15" is incorporated in the base 12. A leg portion 15" of the contact pin 15" can thus be situated under the top face 12A. Subsequently, when a pillar portion 15C' of each contact pin 15' is inserted in the hole 16C, each contact pin 15' can be incorporated in the base 12.

In order to mold the base 12 by a die and remove the base 12 after molding from the die, it is merely necessary to open the die perpendicular to the base 12 and pull out pieces of the die for molding an opposite face 12A' of the top face 12A downwardly from areas in which the holes 16A are configured.

Although in the embodiment the holes 16B are configured to protrude from the holes 16A toward the ends of the base 12, they may be configured to protrude toward the enter of the base 12. In this alternate configuration, the leg portions 15E" of the contact pins 15" can be located inside the top face 12A.

Figure 11:
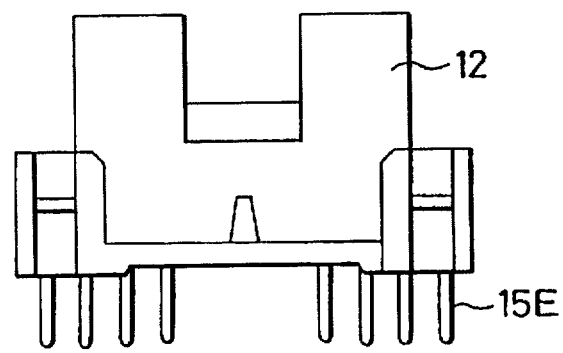
FIG. 11 is a side view showing the socket body of FIG. 8A in which four kinds of contact pins having different leg portions are incorporated.

The contact pins 15 of this embodiment are available in only two kinds of contact pins 15' and 15". If, however, more kinds of contact pins 15 are provided and the holes 16 of the base 12 are configured not only at the positions of the holes 16B and 16C, but also at other various positions on the bottom of the base 12. For example, as illustrated in FIG. 11, leg portions 15E can be arranged in such a way that their positions are gradually shifted with respect to the base 12 (four kinds of contact pins are shown in FIG. 11).

Furthermore, in the embodiment, the pillar portions 15C' and 15C" of the contact pins 15' and 15" are different in shape. However, they may assume the same shape. Specifically, if the pillar portions 15C' and 15c" are made to have the same shape, the holes 16B and 16C are also made to have the same shape and configured to project from the holes 16A, and only the positions of the leg portions 15E' and 15E" corresponding to the pillar portions 15C' and 15C" are changed to constitute the contact pins 15' and 15". In this way, the positions of the leg portions 15E' and 15E" on the base 12 may be changed.

Figure 12:
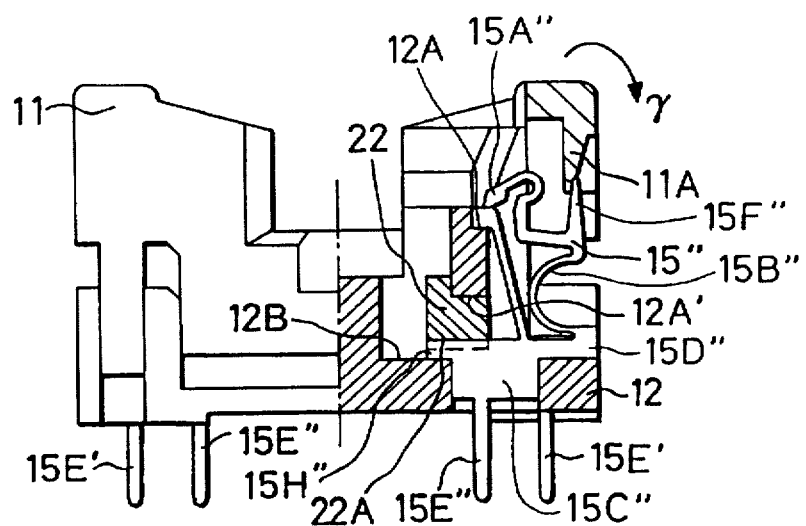
FIG. 12 is a view showing another embodiment of the IC socket according to the present invention.
Figure 13:
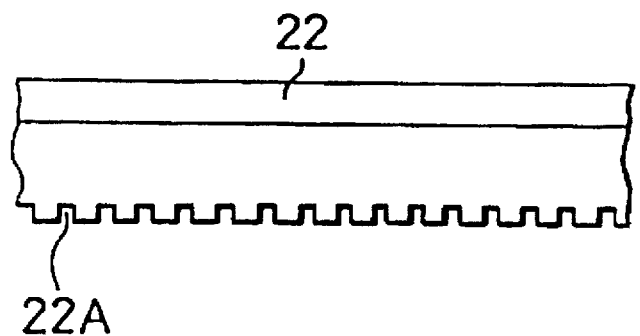
FIG. 13 is a partially enlarged view showing a contact pin fixing block used in the IC socket of FIG. 12.

FIG. 12 shows another embodiment of the IC socket according to the present invention. In this figure, the base 12 and the contact pins 15' and 15" are the same as those shown in FIGS. 8A, 8B, 9A, and 9B. Reference numeral 11 represents the cover and reference numeral 22 represents a contact pin fixing block, which has a large number of slits 22A configured on its bottom as shown in FIG. 13.

After the contact pins 15' and 15" are incorporated in the base 12, the contact pin fixing block 22 is forced between the opposite face 12A' of the top face 12A and the base portions 15D' and 15D" of the contact pins 15' and 15" so that individual upper portions of the base portions 15D' and 15D" of the contact pins 15' and 15" are inserted in the slits 22A.

When the cover 11 is pushed downwardly in order that the integrated circuit 17 can be mounted to, or dismounted from, the IC socket, working portions 15F' and 15F" of the contact pins 15' and 15" are pressed by the projecting cam 11A. Thus, curved portions 15B' and 15B" of the contact pins 15' and 15" are flexed. Consequently, the contact portions 15A' and 15A" are separated from the top face 12A. At this time, the contact pins 15' and 15" are subjected to such force as to cause a rotation in the direction of an arrow 7 shown in FIG. 12, and thus tips 15H' and 15H" of the base portions 15D' and 15D" of the contact pins 15' and 15" may rise upwardly from the fixed face 12B. In this case, a supporting force between each of the base portions 15D' and 15D" and the base 12 is decreased, and the pressure of contact between each of the contact portions 15A' and 15A" and each lead of the integrated circuit is diminished. This reduction of contact pressure causes an increase in resistance of contact between each of the contact pins 15' and 15" and each lead or a failure in connection therebetween.

However, as in the embodiment of FIG. 12, contact pin fixing block 22 is forced between the opposite face 12A' of the top face 12A and the base portions 15D' and 15D" of the contact pins 15' and 15". Therefore even though the tips 15H' and 15H" of the base portions 15D' and 15D" of the contact pins 15' and 15" tend to rise upwardly from the fixed face 12B, their upward movement will be suppressed by the contact pin fixing block 22 which is restricted by the opposite face 12A' of the top face 12A. The tips 15H' and 15H" cannot thus rise. This eliminates the instability of mounting of the contact pins 15' and 15" to the base 12. Also, the contact pin fixing block may be merely forced between the opposite face 12A' of the top face 12A and the base portions 15D' and 15D" of the contact pins 15' and 15" or may be fixed to the base 12 by an adhesive, screws, or other proper means.

Figure 14:
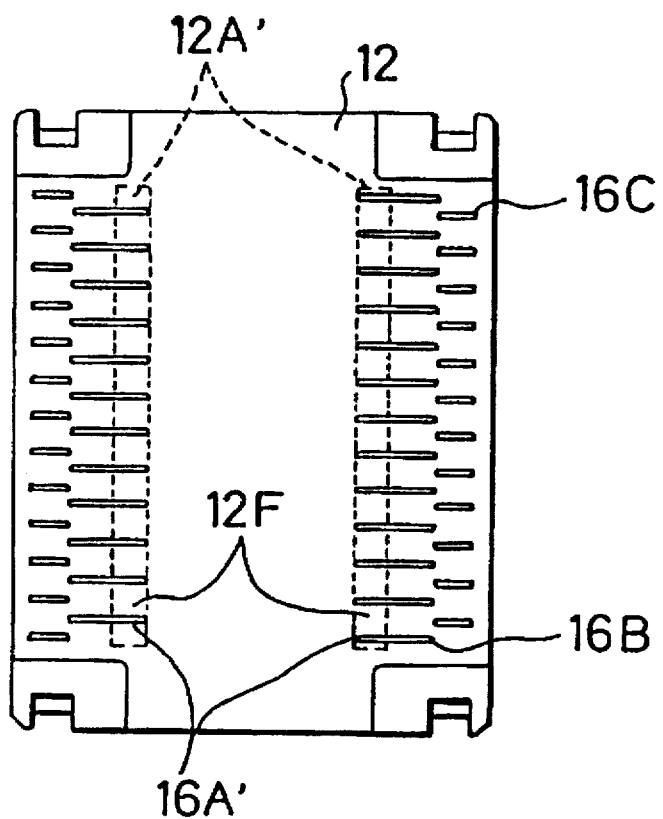
FIG. 14 is a bottom view showing a socket body in still another embodiment of the IC socket according to the present invention.

FIG. 14 shows the bottom of the base 12 used in yet another embodiment of the IC socket according to the present invention. In this figure, portions indicated by broken lines denotes the top face 12A. This embodiment includes partition walls 12F for dividing the contact pins 15" from one another, extending perpendicularly from the opposite face 12A' of the top face 12 toward the bottom of the base 12 among the holes 16B. That is, in this embodiment, each of holes 16A' is subdivided by the partition walls 12F extending from the opposite face 12A' of the top face 12A. Further, the base portions 15D' of the contact pins 15' are configured to have lengths that do not do abut on the partition walls 12F. Other portions are the same as in the above embodiment.

Even with the base 12 having such a configuration, when the base 12 is molded by a die and then removed therefrom, pieces of the die for molding portions corresponding to the partition walls 12F on the opposite side of the top face 12A can be pulled out from the subdivided holes 16A' as in the above embodiment. Moreover, since the portions corresponding to the partition walls 12F have the positional relationship such that the opposite face of the top face 12A extends to the same face as the bottom of the base 12, no difficulty is caused when the base 12 is removed from the die.

When the partition walls 12F are configured in this way, the contact pins 15" incorporated in the adjacent holes 16B can be safely insulated from one another. The partition walls 12F need not necessarily be configured to extend to the bottom of the base 12 as shown in FIG. 14, and it is only necessary that they are long enough to insulate the adjacent contact pins 15" from one another.

In the embodiment, to mount the contact pin fixing block 22, the partition walls 12F are constructed so that, at least, the position of the lower end of each partition wall 12F is located above the base portion 15D' of the contact pin 15'. Further, a portion corresponding to the partition walls 12F, of the contact pin fixing block 22, is configured with an offset so that the contact pin fixing block 22, when inserted, is prevented from touching the partition walls 12F. Still further, to mount the contact pin fixing block 22, a part thereof has a configuration such as to extend from the underside of each partition wall 12F to the upside of the base portion 15D' of each contact pin 15'. In this way, it is only necessary to fix the contact pins 15'. Also, each contact pin 15" is fixed by a portion lying on each hole 16A', of the contact pin fixing block 22.

Although, in all the above embodiments, the contact pins 15' and 15" is equipped with the resting portions 15G' and 15G", the present invention is also applicable to the IC socket of the system, such as that stated with reference to the prior art, that the resting portions 15G' and 15G" are not provided and the leads of the integrated circuit are placed directly on the top face 12A.

Moreover, in this embodiment, the contact pins 15' and 15" are provided with the working portions 15F' and 15F" pressed by the projecting cam 11A of the cover 11 so that the contact portions 15A' and 15A" come in or out of contact with the leads of the integrated circuit by the vertical movement of the cover 11. The present invention, however, is not limited to such an IC socket, but is also applicable to an IC socket in which the contact pins 15' and 15" are moved, for example, by the rotation of a lever or the sliding of a slider, so that the contact portions 15A' and 15A" come in or out contact with the leads of the integrated circuit.

What is claimed is:

1. An IC socket comprising:

contact pins each having a leg portion formed as a lower portion thereof for connection with an external circuit, a contact portion formed as an upper portion thereof for contact with each lead of an electric part which is to be connected with the external circuit, and a base portion extending laterally between said leg portion and said contact portion; and a base having a mount face with which said base portion comes in close contact, a plurality of holes provided in a portion of said base in which said leg portions of said contact pins are respectively inserted when each of said contact pins are mounted, a top face for placing said leads of the electric part thereon directly or indirectly, and a back face which is formed on a reverse side with respect to said top face, said top face and said back face being located above said mount face, said holes being spaced away from each other at positions approximately under said back face, space passing downwardly through said base and being formed just under an entire surface of said back face and above said holes, and wherein portions of said base, including at least said top face and said portion of said base having holes provided therein are integrally constructed.

2. An IC socket according to claim 1, wherein contact pin fixing blocks for pressing and fixing the base portion of each of said contact pins are arranged under said back face.

3. An IC socket according to claim 1, wherein said contact portion includes a first subportion and a second subportion facing said first subportion for sandwiching said leads of the electric part between said first and second subportions.

4. An IC socket according to claim 3, wherein said first subportion rests on said top face.

* * * * *